United States Patent [19]

Tseng

[11] Patent Number: 6,080,636
[45] Date of Patent: Jun. 27, 2000

[54] PHOTOLITOGRAPHY ALIGNMENT MARK MANUFACUTURING PROCESS IN TUNGSTEN CMP METALLIZATION

[75] Inventor: Horng-Huei Tseng, Hsinchu, Taiwan

[73] Assignee: Vanguard International Semiconductor Corporation, Hsinchu, Taiwan

[21] Appl. No.: 09/379,280

[22] Filed: Aug. 23, 1999

Related U.S. Application Data

[62] Division of application No. 08/868,844, Jun. 9, 1997, Pat. No. 5,972,793.

[51] Int. Cl.[7] .................. H01L 21/76; H01L 23/544
[52] U.S. Cl. .................. 438/401; 438/975; 257/797
[58] Field of Search ................ 438/401, 975; 257/797

[56] References Cited

U.S. PATENT DOCUMENTS

| | | | |
|---|---|---|---|
| 5,264,310 | 11/1993 | Kawai | 430/5 |
| 5,264,395 | 11/1993 | Bindal et al. | 438/404 |
| 5,503,962 | 4/1996 | Caldwell | 438/975 |
| 5,578,519 | 11/1996 | Cho | 438/975 |
| 5,663,099 | 9/1997 | Okabe et al. | 438/975 |
| 5,733,801 | 3/1998 | Gojohbori | 438/975 |
| 5,783,490 | 7/1998 | Tseng | 257/797 |
| 5,858,854 | 1/1999 | Tsai et al. | 438/401 |
| 5,904,563 | 5/1999 | Yu | 438/401 |

*Primary Examiner*—Kevin M. Picardat
*Attorney, Agent, or Firm*—George O. Saile; Stephen B. Ackerman

[57] ABSTRACT

A method is disclosed for forming alignment marks at the outer perimeter of wafers where they are not susceptible to much damage during chemical-mechanical polishing (CMP) process. Complete protection is provided by recessing the alignment mark into the substrate by etching. Recess etching is accomplished at the same time the isolation trenches are formed to delineate device areas. Thus, alignment marks are provided with a protective recess without extra steps. Furthermore, by forming alignment marks at the outer perimeter of the wafer, productivity is improved by providing maximum usage of wafer area for integrated circuits.

2 Claims, 6 Drawing Sheets

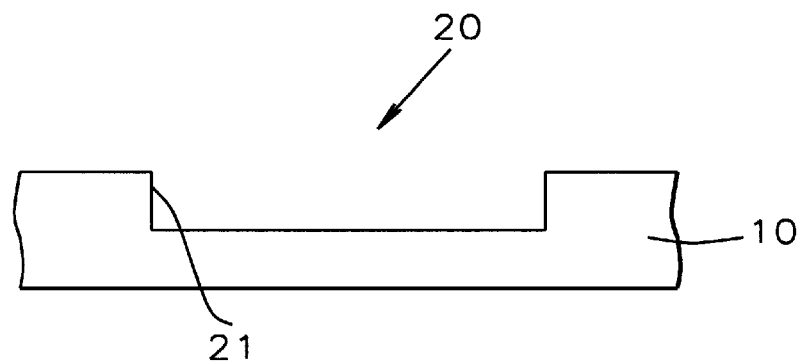
FIG. 1a – Prior Art
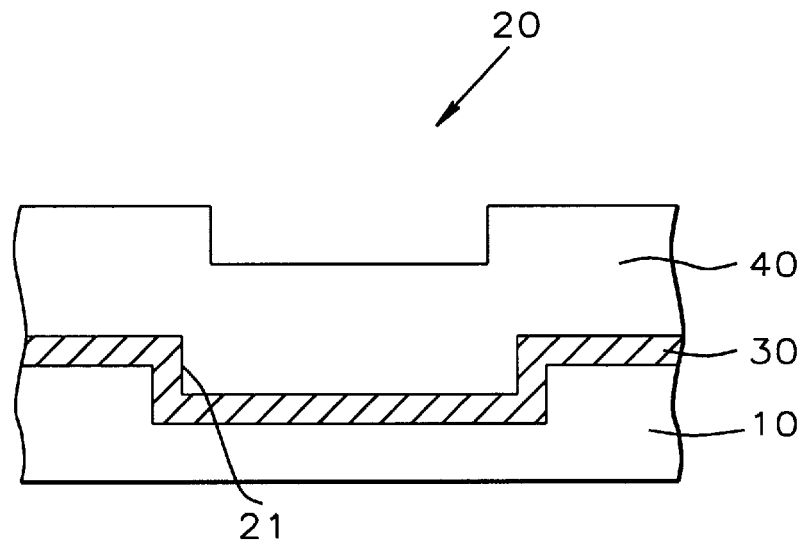
FIG. 1b – Prior Art

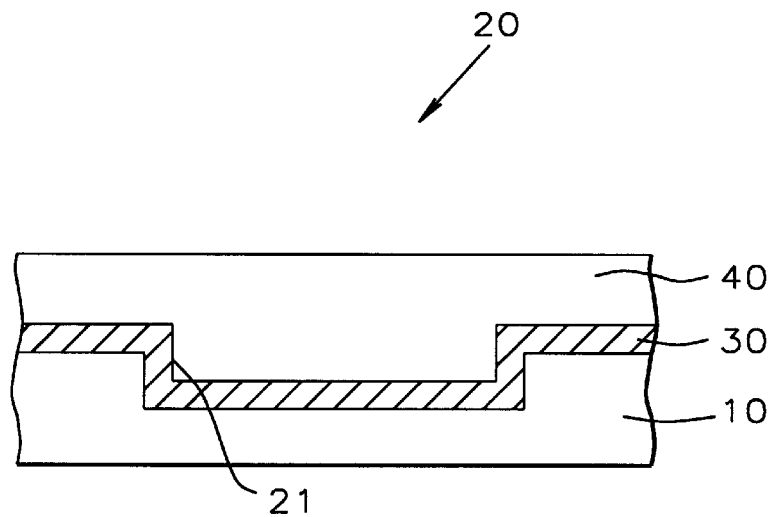
FIG. 1c - Prior Art
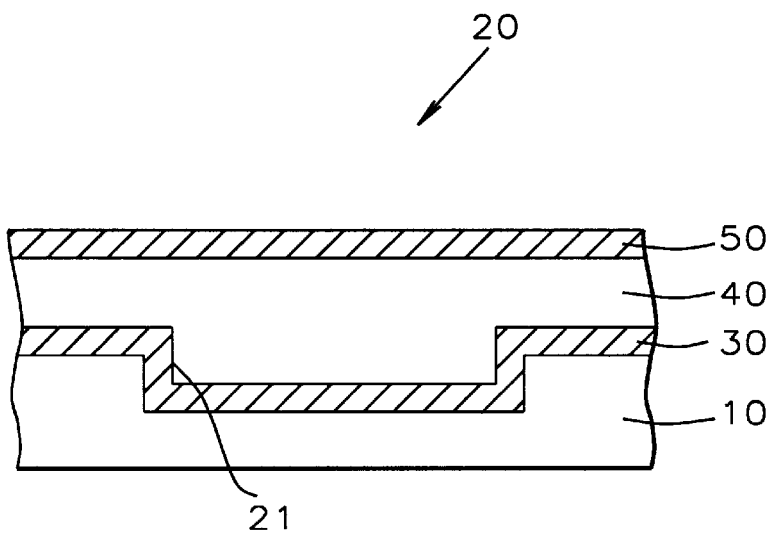
FIG. 1d - Prior Art

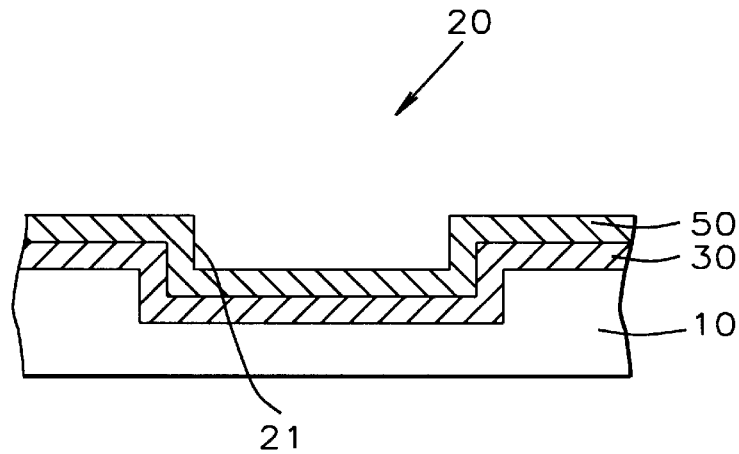
FIG. 1e – Prior Art
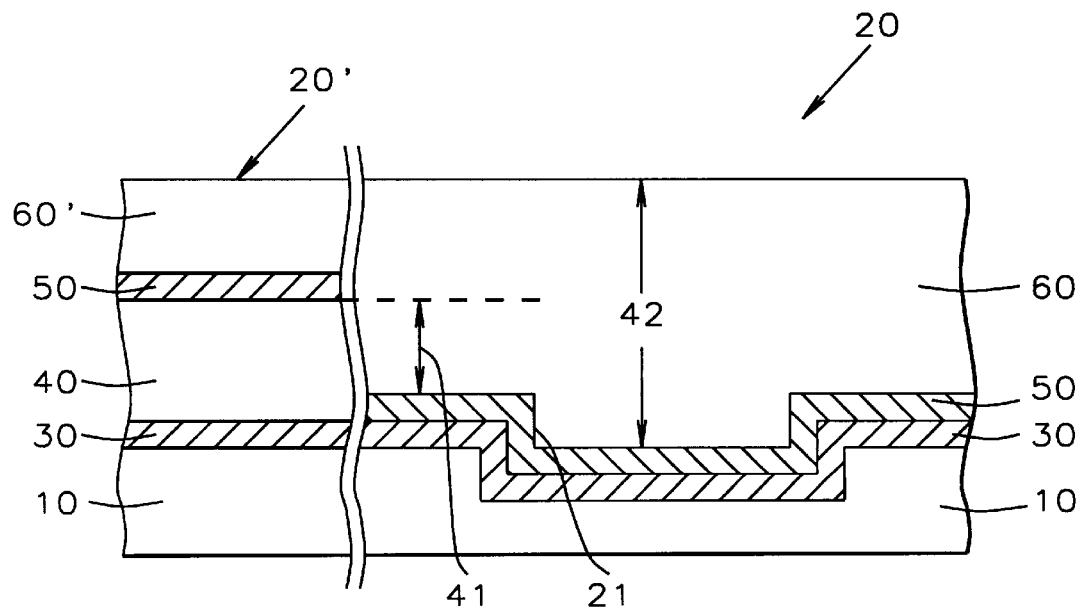
FIG. 1f – Prior Art

PHOTOLITOGRAPHY ALIGNMENT MARK MANUFACUTURING PROCESS IN TUNGSTEN CMP METALLIZATION

This is a division of patent application Ser. No. 08/868, 844, filing date Jun. 9, 1997, now U.S. Pat. No. 5,972,793, A Photolithography Alignment Mark Manufacturing Process In Tungsten Cmp Metallization, assigned to the same assignee as the present invention.

BACKGROUND OF THE INVENTION (1) Field of the Invention

The present invention relates generally to the forming of alignment marks in wafers in semiconductor manufacturing, and more particularly to the forming of alignment marks after CMP planarization.

(2) Description of the Related Art

Alignment marks are some of the key features in manufacturing semiconductor components on multilayered substrates such as silicon or gallium arsenide. This is because, the components that make up the integrated circuits are fabricated by aligning many intricate layers of conductors and insulators, one upon the other with reference to alignment marks. And, in the resulting structure, called wafer, it is critical that each layer is precisely aligned with the previous layer so that the circuits formed therein are functional and reliable. However, each layer so aligned is subsequently subjected to different processes such that as a result of the process, the alignment mark on that layer may be marred or, in some instances, totally removed thereby making it difficult, or, even impossible, to perform the next process that will require alignment.

Chemical-mechanical polishing, or CMP, which is a commonly used process in the manufacture of semiconductor wafers, is one such process where damage to alignment marks can be substantial. As is well known in the art, CMP involves the chemical etching of a surface while also mechanically grinding or polishing it. Because wafers are fabricated by forming many layers of different materials one on top of another, it is important that each layer is extremely flat and smooth, that is planarized, before receiving another layer. It has been found that CMP is extremely well suited for planarizing whole or portions of wafers and it has become one of the most important techniques for planarizing layers in wafers. However, while very useful in a particular process of planarizing wafers, CMP can complicate matters in other set of processes, such as in preserving the integrity of alignment marks that have already been formed on layers for the purposes of aligning one layer with respect to the next one. This is clearly understood when given the abrasive nature of chemical-mechanical polishing.

The nature of the problem cited above can be seen by noting that CMP is generally accomplished by polishing the surface of a wafer against a polishing pad wetted with a slurry comprised of three ingredients: an acidic or basic solvent, an abrasive, and a suspension fluid. The combined action of surface chemical reaction and mechanical polishing allows for a controlled, layer by layer removal of a desired material from the wafer surface, resulting in a preferential removal of protruding surface topography and a planarized wafer surface. Thus, if features such as alignment marks on the surface of a wafer are exposed to CMP action, they will be removed. There are methods disclosed in prior art for recovering damaged alignment, but at a cost and with much complicated procedures as discussed below.

Typically, the alignment of one layer with respect to another is accomplished by means of a tool known as a wafer stepper. The wafer stepper is used to project optically a circuit pattern from a reticle mounted in the wafer stepper onto a layer formed on the semiconductor wafer. However, before the pattern on the reticle is transferred, the wafer must first be positioned or aligned precisely with respect to the reticle. Thus, a wafer ready to be patterned is loaded onto a wafer stepper. Then, using the alignment marks already on the wafer, the wafer is aligned in relation to the reticle. Once the alignment is accomplished, the remaining steps of projecting the pattern on to the semiconductor may proceed.

As is well known in the art, the position of the alignment mark on the wafer is commonly sensed by means of a laser beam. The laser beam in the stepper is bounced off of the alignment mark to create a slonal pattern of laser light. The defraction from the mark is reflected back to sending devices in the stepper and is used as a signal to measure the exact position of the alignment mark. It is to be noted that the sensed quality of the detractive light from the alignment mark is directly dependent upon the integrity of the structure of the alignment mark. The present invention is concerned with the loss of integrity of alignment marks after CMP planarization of tungsten metal and the forming of a new alignment mark right after the planarization step as disclosed later.

In general, alignment marks that are formed in a wafer are subjected to the same and many process steps that the rest of the wafer experiences. The steps include deposition of conductors, insulators, etching of the same, polishing, grinding and so on. After and before each one of these steps, the alignment mark must preserve its exact dimensions and be visible to the observing beam, such as the laser beam, so that alignment of various layers with respect to the mark will always be precisely repeatable.

Alignment marks are usually of a simple geometrical shape such as a rectangle or a cross and are commonly etched with a relatively shallow depth into the silicon substrate of wafer (10) shown in FIG. 1a. The position of the alignment mark is sensed by the beam as it traverses edge (21) of mark (20). Therefore, the integrity of the edge dimension must be preserved throughout the various process steps of the wafer. When relatively thin and conformable materials such as oxides are deposited on a wafer, the alignment marks are also deposited with the material. However, because the deposited material is conformal, the exact shape and depth of the alignment mark is replicated. Consequently, the alignment beam can sense the exact step of the edge and hence the alignment mark. Even when the wafer is polished flat, as long as the material- such as the wellknown interlevel dielectrics, ILD- is transparent to the beam, the alignment mark in the layer below can still be seen and recognized. There are times, however, when materials, such as conductor metals, that are opaque to the observing beam are deposited over polished flat ILDs. In that case, the alignment mark is hidden below the metal layer and cannot be reckoned by the alignment system. Methods for circumventing these kinds of situations must be found, and though there are a few such prior art methods, not all of them address some unique problems that arise in the manufacture of semiconductor wafers, as discussed later.

Some of the common problems encountered in prior art techniques of generating alignment marks are well known. Generally, an alignment mark is formed by etching a predetermined depth into the semiconductor 10 shown in FIG. 1a. The etching process forms a step height (21) in wafer (10). Step height (21) acts as the alignment mark and is usually chosen to be some multiple of the wavelength of the laser light used by the stepper to conduct alignment. By utilizing an alignment mark which is ¼ multiple of the laser wavelength, the signal to noise ratio of the laser defraction is optimized, resulting in optimum alignment precision.

Next, the conventional steps of fabricating a semiconductor wafer are continued. Thus, subsequent layers used to form the integrated circuit are grown and deposited. For example, polysilicon conductor is deposited over the wafer as shown in FIG. 1b. This step usually follows the growing of field isolation regions (not shown) elsewhere on the wafer where IC devices are formed. The polysilicon layer is then covered with the deposition of an ILD layer (40). Although the original alignment mark (20) is covered by subsequent layers, the step height (21) and therefore, the alignment mark (20) is replicated in the subsequently deposited layers. The replicated alignment marks are used for aligning and patterning the subsequent layers. That is, as more layers are added to the IC, the step height of the alignment mark is propagated upward or is "built upward" with subsequent layers. The step height of the alignment mark is therefore preserved in subsequent layers so that alignment of subsequent layer can be accomplished.

A problem that is well recognized with building up the alignment mark is its incompatibility with global planarization techniques, such as the chemical-mechanical polishing (CMP). As more and more layers are added to the wafer manufacturing process, and circuit density increases, the requirement to planarize the wafer topography at intermediate steps in the process becomes essential. As is well known in the art, it is important to planarize surfaces of multilevel integrated circuits because nonplanar surfaces interfere with the optical resolution of subsequent photolithography processing steps. This makes it extremely difficult to print high resolution lines. Additionally, nonplanar surface topographies can effect subsequently formed metal layers. If a step height is too large, there is a serious danger that open circuits will be formed in later metal layers. It has been found in prior art that the best way to planarize the wafer topography is to planarize the ILDs and to use a global planarization technique, such as CMP. Global planarization techniques planarize the entire wafer surface and make the surface essentially flat. Unfortunately, when ILD (40) in FIG. 1b is globally planarized, ILD all over the wafer including that which is over the alignment mark (21) is also planarized. The global planarization technique, therefore, removes the alignment mark replicated in ILD (40), as shown in FIG. 1c.

Although the alignment mark has been removed during the global planarization step, the next process step, which is typically a contact etch step, can still proceed because the alignment mark (21) is visible through the transparent ILD (40). That is , the contact etch pattern step can be aligned to the step height formed in polysilicon layer (30).

The next step in the fabrication of ICs typically is the formation of metal interconnects. As shown in FIG. 1d, a metal layer (50) is blanket deposited over ILD and into contact holes (not shown) in the wafer. Because metal layers are opaque, the step height (21) of alignment mark (20) formed in polysilicon layer (30) is invisible to the stepper laser. Without a visible alignment mark or an alignment mark replicated in metal layer (50), it is impossible to align the reticle to generate the metal interconnection pattern.

One solution to the planarized alignment mark problem is an "open frame" process as is known in the art. In an open frame process, after contact alignment, a separate reticle (an open frame reticle) is used to expose the area immediately surrounding alignment mark (20). ILD (40) over alignment mark (20) can then be etched away during the contact etch. Metal layer (50) can then be formed over uncovered alignment mark (20) formed in polysilicon layer (30), as shown in FIG. 2e. Alignment mark (20) recaptured and replicated in metal layer (50) can now be used to align the reticle to generate the metal interconnect pattern.

Because the ILD over the alignment mark (20) is removed during the contact etch step of the "open frame" process described above, it will be appreciated that the elevation of second metal (50) over the alignment mark area (20) will be lower than the elevation of the same second metal (50) extending to other IC areas (20') of wafer (10). The difference in the elevation between the alignment mark area (20) and other areas (20') is depicted with numeral (41) in FIG. 1f. Thus, as is seen in the same FIG. 1f, the ILD (40) that is present between metal layers (30) and (50) in other areas on the wafer is missing over the alignment mark area. When a next layer of ILD (60) is deposited and then globally planarized, in comparison with other areas (20') on the wafer, the total thickness (42) of the dielectric material over the alignment mark area (20) will be increased by the amount (41) that was etched during the first "open frame" process. If one were to use a second "open frame" process now to open the alignment mark (21) below, it is clear that the structures such as shown in areas (20') will not be able to withstand the additional etching required to reach down to the alignment mark (21) as shown in FIG. 1f. In other words, critical areas in other parts of the wafer would be overetched. Hence while "open frame" process is useful in recapturing an alignment mark the first time around, it is not compatible with global CMP when used subsequent times.

Just as lower elevation areas are created over alignment mark areas with the "open frame" process as described above on the one hand, higher elevation areas or "mesas", on the other hand, are created adjacent to alignment mark areas in the absence of "open frame" process. The latter process causing "mesas" will not be repeated here inasmuch as it is not necessary for the understanding of this invention. Suffice it to say that the high mesas at the edges of chip sites adjacent to the alignment mark areas slow down the polish rate of CMP causing yield losses. In prior art, the "elevation difference" problems of high "mesas" and "open frame" process are circumvented by judiciously removing the ILD layers over the alignment mark areas and building upward the alignment mark with metal layers, while removing alternately the metal layers in the area immediately adjacent to the alignment mark areas. In this manner, it is possible to maintain ILD thicknesses relatively the same over the whole wafer after each chemical-mechanical polishing, thereby preventing the over etching of critical areas. At the same time, this method can also avoid the problem of high mesas. However, these methods are usually complex, and they require the use of several masking steps including open frame and inverse open frame reticles with the stepper. What is needed is a less complicated process where alignment marks can be formed relatively easily, especially after the chemical-mechanical polishing of tungsten metal.

Prior art teaches other methods of forming alignment marks. Thus, U.S. Pat. No. 5,264,310 discloses an alignment mark having region formed by energy beam irradiation. In U.S. Pat. No. 5,578,519, a method is taught for forming an aligned key pattern on a wafer. U.S. Pat. No. 5,503,962, on the other hand, teaches a method of forming an alignment mark by filling it and using that alignment mark with chemical-mechanical planarization. All these methods, however, are different from the present invention.

SUMMARY OF THE INVENTION

It is therefore an object of this invention to provide a method of forming alignment marks on a semiconductor wafer.

It is another object of this invention to provide a method for forming alignment marks after tungsten metallization of semiconductor wafers.

It is still another object of this invention to provide a method for forming a step height to accomplish photolithography after tungsten CMP planarization.

These objects are accomplished by providing a substrate having a dielectric layer, patterning the dielectric layer to form holes, depositing metal to accomplish metallization, chemical-mechanical polishing the metal until metal plugs are formed in holes, and etching a portion of metal to form an alignment mark step in the hole.

These objects are also accomplished in another embodiment by providing a substrate having a dielectric layer, patterning the dielectric layer to form holes, depositing metal to accomplish metallization, chemical-mechanical polishing the metal until metal plugs are formed in holes, and etching a portion of the dielectric layer surrounding the plugs to expose a portion of tungsten plugs to form step height to form photolithography alignment mark.

These objects are further accomplished by providing a structure having a recessed step formed in tungsten plugs formed in contact or via holes. In another embodiment, a portion of the tungsten plug structure is exposed above the surrounding dielectric layer to form a plurality of steps for photolithographic alignment at the next process step.

BRIEF DESCRIPTION OF THE DRAWINGS

The objects and features of this invention will become apparent more readily from a reading of the description in conjunction with drawings wherein similar numerals refer to similar parts throughout the several views that follow:

FIG. 1a is a cross sectional view showing the conventional forming of an alignment mark in a semiconductor substrate.

FIG. 1b is a cross sectional view showing the conventional forming of subsequent layers of polysilicon and interlevel dielectric of a semiconductor device on the substrate of FIG. 1a.

FIG. 1c is a cross sectional view showing the conventional global planarization of the substrate of FIG. 1b.

FIG. 1d is a cross sectional view showing the conventional forming of a metal layer on the substrate of FIG. 1c.

FIG. 1e is a cross sectional view showing the conventional "open frame" process for recapturing the buried alignment mark of FIG. 1d.

FIG. 1f is a cross sectional view showing the thickness variation of the interlevel dielectric layer across the substrate of FIG. 1e.

FIG. 2b is a cross sectional view showing the forming of a tungsten metal layer according to this invention over the substrate of FIG. 2a.

DESCRIPTION OF THE PREFERRED EMBODIMENTS

Figure 2A:
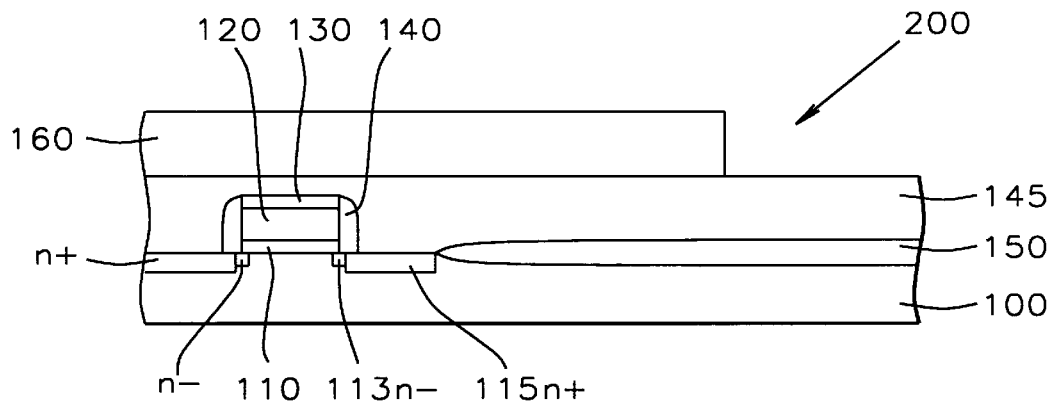
FIG. 2a is a cross sectional view showing the substrate of this invention having semiconductor devices and a hole formed therein.

Referring now to the drawings, in particular to FIGS. 2a–2e, there are shown steps for forming an alignment mark comprising a step on a wafer. However, the preferred methods disclosed here pertain to forming alignment marks after the obliteration of the original alignment marks (not shown) following the chemical-mechanical polishing of the tungsten metal layer forming plugs in contact or via holes. As already described in related art previously, the original alignment marks that are formed in the silicon substrate, as shown in FIGS. 1a–1f, become unusable during the subsequent processes in which the alignment mark step is covered by an opaque material that does not replicate the shape of the step and hence that of the alignment mark. Thus, for the reasons stated, the conventional alignment mark formed elsewhere in the substrate and used to perform the subsequent process steps up to and including the chemical-mechanical polishing of the metal layer is not shown here in order not to unnecessarily obscure the present invention, and also, as it is not necessary to the understanding of the disclosed method of this invention. It will be appreciated by those skilled in the art that the disclosed method of generating a new step as an alignment mark as a part of the normal process steps is an added advantage in the manufacture of semiconductor devices.

In FIG. 2a, substrate (100), preferably silicon, is provided with gate oxide (110) and source/drain regions delineated by field oxide regions (150). Gate electrode (120) is formed over gate oxide (110) and covered with another oxide layer (130) at the top region while its sidewalls are shaped further by oxide spacers (140). It is preferred that the top oxide (130) has a thickness between about 1000 to 2000 angstroms (Å). Oxide spacers (140) are formed during the fabrication of the lightly doped drain structures (113) near source (115).

An interlevel dielectric layer (ILD), (145), with thickness between about 3000 to 8000 Å is next formed preferably by doping silane-formed $Sio_2$ film with phosphorous and boron. The resulting BPSG layer is obtained by performing a low pressure plasma enhanced chemical vapor deposition (LPCVD). This is followed by forming a contact hole and first metal, preferably aluminum. Contact hole and first metal are not shown in FIGS. 2a–2e so as to not obscure the key point of forming a photolithography alignment mark of this invention in a hole, whether a contact hole or a via hole, as described below. An interlevel-metal dielectric layer (IMD), (160), is next deposited to a thickness between about 3000 to 10,000 Å over the ILD layer (145) in FIG. 2a by employing a low pressure plasma enhanced chemical vapor deposition (LPCVD).

Figure 2B:
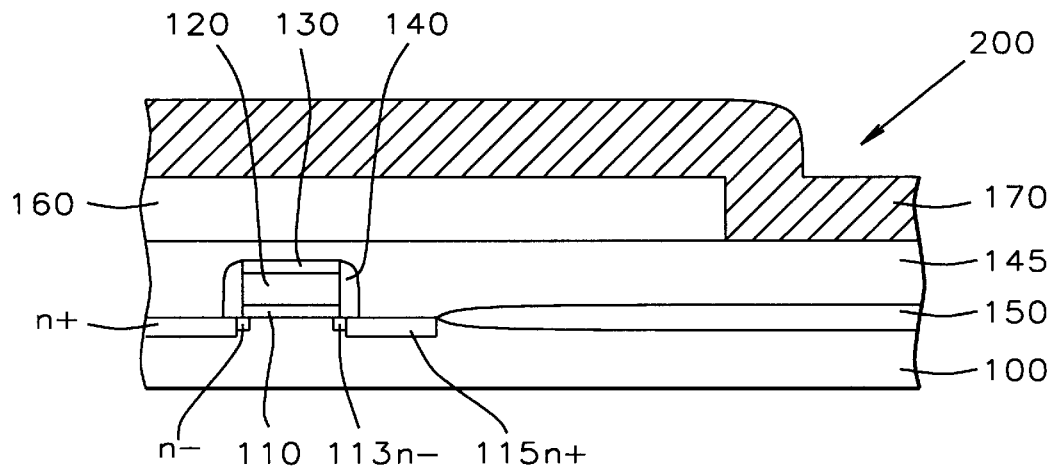

The substrate of FIG. 2a is then patterned to form via holes. For clarity, only via hole (200) is shown. It will be observed that the original alignment mark formed (not shown) in silicon would still be visible through the dielectric layers (160) and (145) in order to be able to register the patterning mask which is not shown here. Next, as shown in FIG. 2b, CVD tungsten is formed covering the whole substrate. Preferably, this is accomplished by silicon reduction of tungsten hexafluoride, $WF_6$.

Figure 2C:
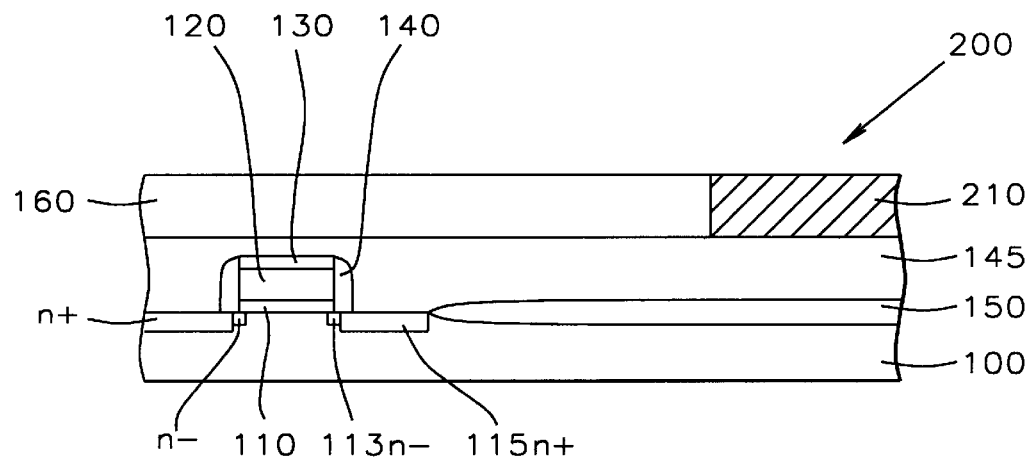
FIG. 2c is a cross sectional view showing the chemical-mechanical polishing of the substrate of FIG. 2b according to this invention.

Next, to form tungsten stud (210) in via hole (200), chemical-mechanical polishing (CMP) of tungsten layer (170) is performed. CMP is accomplished by using a slurry preferably comprising the combination of three ingredients: hydrogen peroxide ($H_2O_2$) dissolved in water, silica as an abrasive, and ethylene glycol in which the abrasive is suspended. CMP is continued until tungsten is completely removed from the surface of ILD layer (160) on the substrate and leaving only the metal plug (210) in hole (200) as shown in FIG. 2c. It will be appreciated that the blanket metal tungsten as well as the interlevel dielectric layer (160) below it now covers everywhere on the substrate where there is a cavity including the original alignment mark area mentioned above and not shown in FIGS. 2a–2e. In other words, after the CMP process, the original alignment mark step is no longer replicated and is covered with opaque metal layer and therefore is not usable.

Figure 2D:
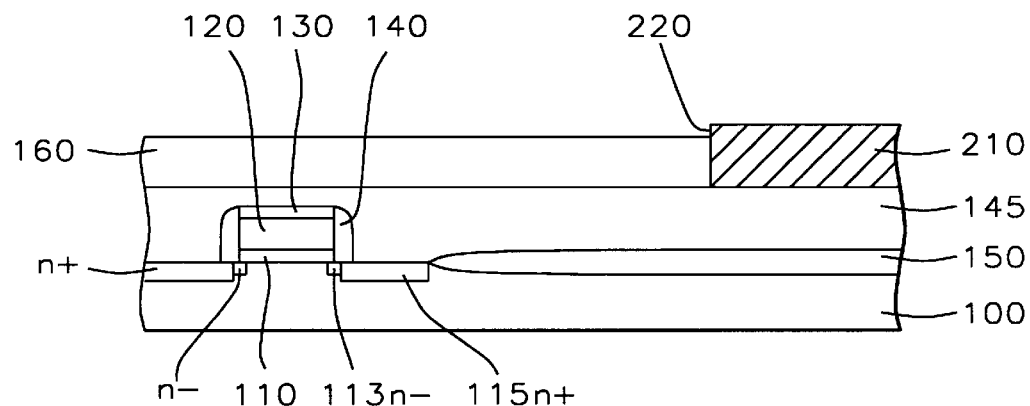
FIG. 2d is a cross sectional view showing the forming of an alignment mark step by etching a portion of the interlevel dielectric layer of FIG. 2c according to this invention.

It is the main and key feature of this invention to perform the next process step where a new step is formed for purposes of alignment during the subsequent process steps. Therefore, a key step in this embodiment is the removal of a portion of IMD layer (160) to form step (220) as shown in FIG. 2d. It is preferred that the step height is between about 1100 to 1300 Å. The step height is formed by a reactive ion etch recipe comprising mixture of fluorocarbon and oxygen with argon, $CF_4+CHF_3+O_2+Ar$.

Figure 2E:
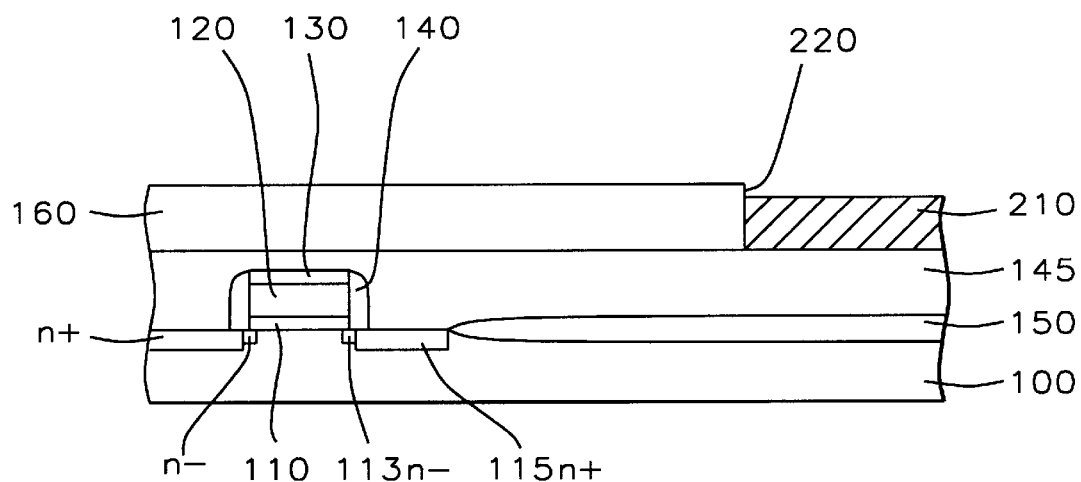
FIG. 2e is a cross sectional view showing another embodiment of forming of an alignment mark step by etching a portion of the tungsten layer of FIG. 2c according to this invention.

Alternatively, in a second embodiment, shown in FIG. 2e, alignment step (220) is formed by removing a portion of tungsten metal from plugs (210). It is preferred that the step height in this second embodiment is also between about 1100 to 1200 Å. The step height is formed by a reactive ion etch recipe comprising mixture of fluorocarbon and brominechloride with oxygen, i.e., $CF_4$ and $BCl_3+O_2$.

It is disclosed, therefore, that with a simple additional process step, and without the need for conventional "open frame"-like processes, alignment mark can be reformed easily. Furthermore, the process of forming the step can be selected between etching the dielectric layer or the metal plug depending upon the process flow on the manufacturing line. Though these numerous details of the disclosed method are set forth here, such as process parameters, to provide an understanding of the present invention, it will be obvious, however, to those skilled in the art that these specific details need not be employed to practice the present invention. At the same time, it will be evident that the disclosed methods may be employed in other similar process steps that are too many to cite, such as after the formation of contact holes or via holes in the manufacture of semiconductor devices. That is to say, the disclosed method of re-forming alignment marks may be repeated as many times as needed to form additional metallized layers in forming semiconductor wafers.

Thus, while the invention has been particularly shown and described with reference to the preferred embodiments thereof, it will be understood by those skilled in the art that various changes in form and details may be made without departing from the spirit and scope of the invention.

What is claimed is:

1. An alignment mark step structure comprising:
   providing a semiconductor substrate having a dielectric layer with a hole therein;
   a metal plug in said hole; and
   a recess in said dielectric layer to form a step down between about 1100 to 1300 Å from said metal plug.

2. An alignment mark step structure comprising:
   providing a semiconductor substrate having a dielectric layer with a hole therein;
   a metal plug in said hole; and
   a recess in said metal plug to form a step between about 1100 to 1200 Å from said dielectric layer.

* * * * *